United States Patent
Lin et al.

(10) Patent No.: US 9,400,858 B1
(45) Date of Patent: Jul. 26, 2016

(54) VIRTUAL VERIFICATION MACHINE FOR A HARDWARE BASED VERIFICATION PLATFORM

(71) Applicant: Cadence Design Systems, Inc., San Jose, CA (US)

(72) Inventors: Tsair-Chin Lin, Saratoga, CA (US); Jingbo Gao, San Jose, CA (US); Yevgen Ryazanov, San Jose, CA (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days.

(21) Appl. No.: 14/505,414

(22) Filed: Oct. 2, 2014

(51) Int. Cl.
*G06F 9/455* (2006.01)
*G06F 17/50* (2006.01)

(52) U.S. Cl.
CPC ........ *G06F 17/5045* (2013.01); *G06F 17/5009* (2013.01)

(58) Field of Classification Search
USPC .......................... 716/104, 106, 107, 108, 136
See application file for complete search history.

(56) References Cited

U.S. PATENT DOCUMENTS

| | | | | |
|---|---|---|---|---|
| 6,061,511 A * | 5/2000 | Marantz | ............. | G06F 17/5027 703/23 |
| 6,073,194 A * | 6/2000 | Lowe | ............................ | 710/100 |
| 8,467,436 B1 * | 6/2013 | Warner | .................. | H04L 1/205 375/219 |
| 2004/0019860 A1 * | 1/2004 | Lee | .................................. | 716/4 |
| 2009/0204963 A1 * | 8/2009 | Swart et al. | ...................... | 718/1 |
| 2012/0084759 A1 * | 4/2012 | Candea et al. | ................ | 717/126 |

* cited by examiner

*Primary Examiner* — Brian Ngo
(74) *Attorney, Agent, or Firm* — Kenyon & Kenyon LLP

(57) ABSTRACT

Essential information for system operations, memory analysis, and design signal analysis is captured while a hardware based verification platform is performing emulation and testing. This recorded information is then accessible via a memory device and can be used to perform offline debugging with a virtual verification machine (VVM). Users can then release the shared resources and run operation commands to control replay of the design test or emulation in offline mode. Users can access any point in time of the recorded emulation in order to perform detailed design analysis and debugging operations. Offline analysis and debugging may include running certain design cycles, rerunning the emulation until the design reaches a certain state, evaluating memory contents in the design, evaluating design signals for any node in the design, etc.

21 Claims, 5 Drawing Sheets

300

400

500

610

VIRTUAL VERIFICATION MACHINE FOR A HARDWARE BASED VERIFICATION PLATFORM

BACKGROUND

Aspects of the present invention relate generally to the field of system development and test, and more specifically to verification of circuit designs.

Integrated circuit (IC) design is increasingly complex, sometimes involving millions of elements, shapes or geometries, and may be facilitated with an electronic design automation (EDA) tool that allows a designer to interactively position ("place") and connect ("route") various shapes on the circuit. The EDA tool then creates a circuit layout containing the physical locations and dimensions of the circuit's components, interconnections, and various layers from the original design that may then be fabricated, creating the IC. The designed IC is eventually fabricated by transferring or printing the circuit layout to a semiconductor substrate in a series of layers that collectively will form the features that constitute the devices that make up the components of the integrated circuit.

After or during the design and creation of an IC layout, validation, emulation, and debugging operations are often performed on the IC layout using a set of testing, analysis and validation tools. However, such operations for a large and complicated circuit design often require a substantial amount of resources, including both memory and processing power. Designers often have to request access to special resources in order to complete the validation, emulation, and debugging. Such hardware based verification platforms (HBVP) are more powerful than a typical workstation, are often expensive and therefore tend to be shared among teams of designers, and are often used around the clock by various design teams. This limited access to necessary resources often severely affects design schedules.

Accordingly, there is a need in the art for a system that facilitates the debugging by providing comprehensive offline debugging capability, reducing complete reliance on shared testing resources.

BRIEF DESCRIPTION OF THE DRAWINGS

The foregoing and other aspects of various embodiments of the present invention will be apparent through examination of the following detailed description thereof in conjunction with the accompanying drawing figures in which similar reference numbers are used to indicate functionally similar elements.

DETAILED DESCRIPTION

Aspects of the present invention provide a system and method for design verification, emulation, and test that records essential information for system operations, memory analysis, and design signal analysis while the HBVP system is performing emulation and testing. This recorded information is then exported to a database where the recorded information can be used to perform offline debugging with a virtual verification machine (VVM). Users can then release the shared resources and run operation commands to control replay of the design test or emulation in offline mode to go to any point in time of the recorded emulation (or even go back and forth in time) in order to perform detailed design analysis with an offline logic analyzer (OLA) implemented within the VVM. Offline analysis and debugging may include running certain design cycles, rerunning the emulation until the design reaches a certain state, evaluating memory contents in the design, evaluating design signals for any node in the design, etc. Therefore, in offline mode, the system behaves just like an HBVP system, but without using an HBVP machine.

Figure 1:
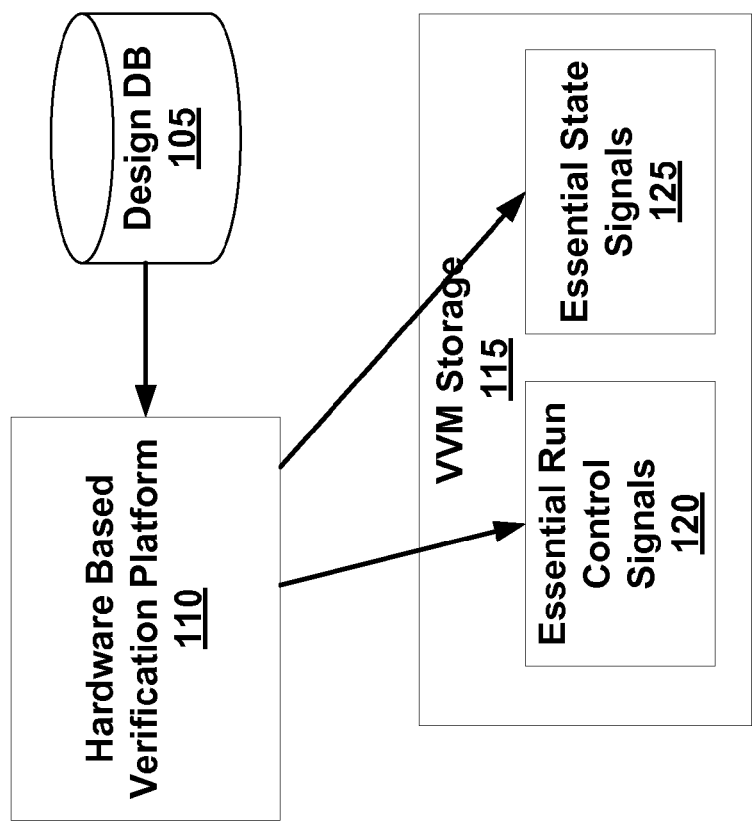
FIG. 1 is a simple block diagram illustrating an exemplary system for design test according to an embodiment.

FIG. 1 is a simple block diagram illustrating an exemplary system 100 for design test according to an embodiment. As shown in FIG. 1, a hardware based verification platform (HBVP) 110 is connected to a design database 105. The database 105 holds the circuit design undergoing test and related information necessary to complete the test and emulation of the design. During the test, certain information will be captured and stored in the VVM storage 115. For example, the data captured may be classified into two types of information, essential run control signals (ERCS) 120 and essential state signals (ESS) 125. These signals will be captured during the design test, and will enable a user to replay the history of the emulation or test in a VVM debug session. Then the user will be able to examine the status of the design at any time within the recorded test as if s/he were debugging on a real machine, while still accessing all the debug information needed.

According to an aspect of an embodiment, the user may highlight or otherwise identify certain signals as significant. Those identified signals will be preserved with a greater frequency or fidelity than other, non-significant signals.

Figure 2:
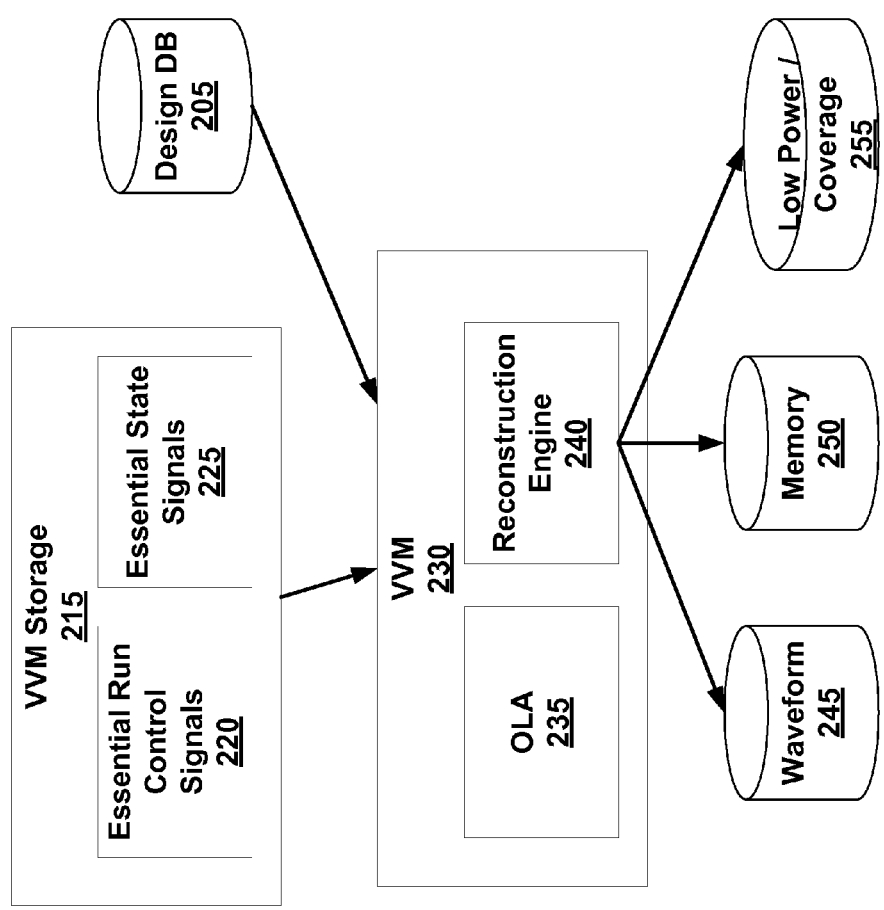
FIG. 2 is a simple block diagram illustrating an exemplary verification virtual machine according to an embodiment.

FIG. 2 is a simple block diagram illustrating an exemplary verification virtual machine according to an embodiment. As shown in FIG. 2, VVM 230 is connected to a design database 205 and a VVM memory 215. As previously described with reference to FIG. 1, the design database 205 holds the circuit design that was tested. Information captured during the test, including the essential run control signals (ERCS) 220 and essential state signals (ESS) 225, is stored in the VVM memory 215.

The VVM 230 includes an offline logic analyzer (OLA) 235 that receives run control and debug commands as set by the user and performs operations to acquire and display the results of the commands. Various commands will be available for the user to analyze the design under test. For example, using a restart command, the user can set the emulation time to a specified time. The VVM will reconstruct the status of the design at that point (set time) in the test. The user will be able to access the memory image and waveforms for selected signals for the test at the set time. Additionally, using a run command, the user can advance the emulation for a specified amount of run time or an unspecified amount of time if the user has defined conditions under which the replay should stop. Specific actions may be set to occur when the defined conditions are met. For example, an alert or other message may be printed or displayed and an event log may be created.

The VVM 230 may additionally include a reconstruction engine 240 that builds or reconstructs any data or signals that were not captured during the test. It may not be practical to collect all the information for the design signals at every clock cycle of the test, as the amount of data would be excessive. Therefore, in order to limit the amount of data collected, certain data may be collected infrequently or not at all.

Any values that could be easily computed, for example, the values of all combinatorial gates, are not collected. Certain data may be collected at a preselected frequency, for example, once every 32 cycles for the value of all state elements in the design whereas other data, such as memory cell outputs, may be collected at every clock cycle. The reconstruction engine 240 will then reconstruct a waveform that includes the element values on every clock cycle. Values used to compute the value of combinatorial gates, as well as the waveform for every design signal, can be reconstructed during replay, when needed during debugging operations, or otherwise in response to a user command that requires the reconstructed information. The VVM 230 can generate all information needed for design debug and design analysis not captured in the VVM memory 215, e.g., design signal waveform, design memory contents, etc. The reconstructed information can be saved in one or more databases or other memory stores 245, 250, 255.

Additionally, the reconstruction engine 240 may provide for memory replay, as a memory image at any time during the test may be reconstructed and stored. As part of the data capture during test, an initial memory image is captured when the test is initiated for all memories in the design. When a user asks to view a memory image at a specified time, the waveform from the beginning of the test to the requested time is reconstructed for memory write ports, including write enable, write address and data in. Based on the waveform for the memory write ports, a memory-write operation is reapplied so that the memory image is reconstructed from the initial capture.

Additionally, once a user has requested the memory for a specific time, the restructured memory image can be saved as a snapshot in the memory store 250. Then, the next time a user requests a memory at a specific time, the memory can be restructured/replayed from the nearest saved snapshot, thereby improving performance of the memory replay the more the reconstruction engine 240 is utilized.

Other operations may benefit from waveform reconstruction of the signals in the design. For example, using Dynamic Power Analysis (DPA), based on signal activities in the design, the signal toggle activities can be collected and used to estimate power consumption. Then a greater amount of toggle activity detected will indicate that the design will consume more power. Additionally, by enumerating the toggle activity of design signals, the modules of the design that are exercised during testing can be identified to provide for a coverage analysis.

Multiple users can access the VVM memory database at the same time, to debug against the same design. Each user can access the same memory but test within a limited scope, for example, one user can work on debugging part A or time segment $T_A$ of the design, and another user can work on debugging part B or time segment $T_B$ of the design.

Figure 3:
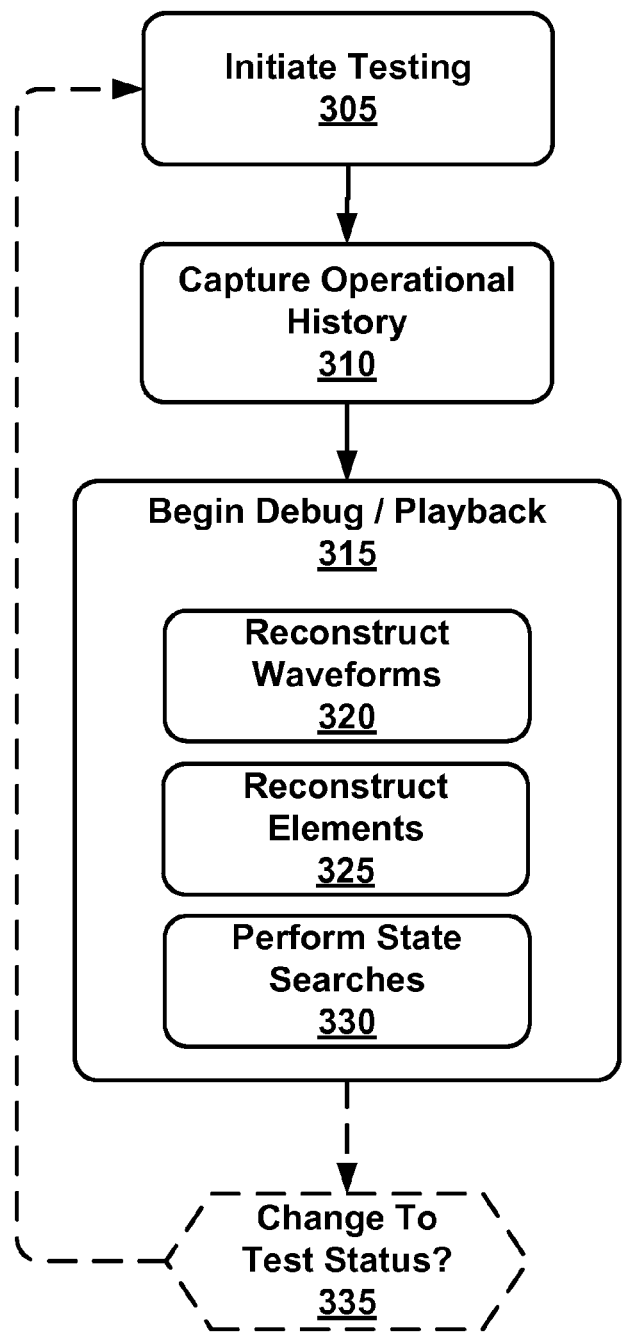
FIG. 3 is a simplified flow diagram illustrating an exemplary method for using a verification virtual machine according to an embodiment.

FIG. 3 is a simplified flow diagram illustrating an exemplary method 300 for using a verification virtual machine according to an embodiment. Initially, a simulation, emulation, or test for a design is initiated on a hardware based verification platform (block 305). Then, during the test, an operational history is captured (block 310). For example, the emulation history may be stored in a database. The information that will be recorded may include an initial snapshot of the status for the whole design, any design status changes during the run, and records of user actions (if any) that may change the design status such as force, release and memory load operations.

Once the test or emulation has been completed, and all the necessary elements of the test captured and saved, the user may access the saved information offline, from a user workstation or other device having access to the VVM and saved data, to begin playback with analysis and debugging procedures (block 315).

During replay and analysis of the test, the waveform for every design signal can be reconstructed, including element values for every clock cycle (block 320). Those signals may be used to compute the values of combinatorial gates (block 325).

Additionally, the VVM provides for a user to define complex searches within the captured test using the offline logic analyzer (OLA) (block 330). Using a set of state machines, a searching condition can be detected. The defined state machines will monitor the status of certain design signals while the design test replay is running After a condition is detected, any one or more of several potential procedures may occur. For example, after detecting a condition, the test replay may be stopped to allow the user to examine the design status. Or test replay may continue to run, and a message may be displayed. Alternatively, after detecting a condition, an event may be logged so that the user can analyze the event log at a later time. The user may also be permitted to execute a debug tool command after a condition is detected.

Multiple state machines may be implemented and operational in parallel and in isolation from each other. Each state machine can have multiple states that may contain multiple actions, as well as stateless actions. Every state machine as well as every action can be enabled/disabled dynamically for any part of the replay run.

A detected condition may be based on signal values provided by the waveform reconstruction. Conditions can include instant expressions using signal values from current run cycle or expressions using values from previous cycles. Conditions can also use values of variables calculated inside state machines and saved between evaluations or runs.

The VVM replay (block 315) can operate from initial states of every state machine or from a state where a state machine stopped during a previous run. The VVM can receive a report about the current state of the replay and then represent that information in a text or graphical report. The VVM also allows a user to see a history of state changes in the test replay in a text or graphical display.

According to an embodiment, if, during debug procedures, the user changes the test in a way that would change the design status, such as memory force, release, or load operations (block 335), the test on the HBVP will need to executed anew (block 305).

Figure 4:
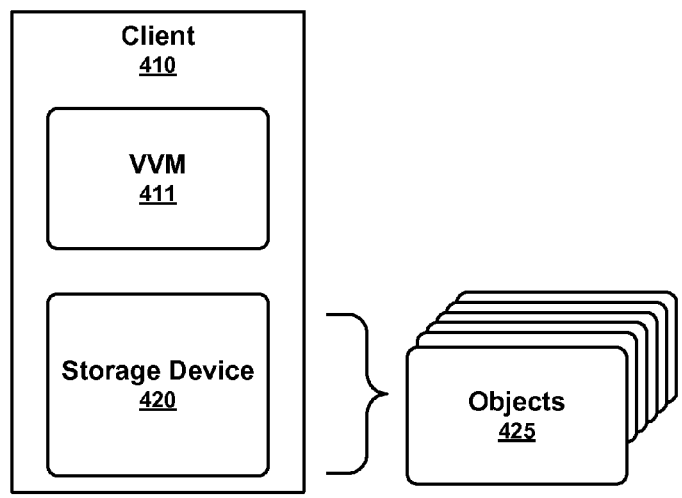
FIG. 4 is a simple block diagram illustrating components of an exemplary system according to an embodiment.

A user may access a VVM interface in a standalone client system, client-server environment, or a networked environment. FIG. 4 is a simple block diagram illustrating components of an exemplary system 400 according to an embodiment. As shown in FIG. 4, a system 400 may comprise a client 410 executing a VVM 411 and having a memory storage 420. The client 410 may be any computing system that executes a VVM 411 or otherwise facilitates access to memory storage 420, for example a personal computer. The client 410 may include a processor that performs a method in accordance with the disclosed embodiments. Such a client would be part of an overall test system in accordance with the disclosed embodiments.

Hardware models, instruction sets, software packages, instances of the modeled components, state information for the modeled components, and other objects 425 used by the VVM 411 may be stored in memory storage 420. A user may access the objects 425 stored in memory storage 420 with the client 410 via the VVM 411, where the VVM 411 is capable of accessing memory storage 420 and displaying the objects 425 and the data associated with the test. The VVM 411 may include a user interface, for example a program, application or middleware that acts as a frontend to and facilitates access to objects in memory storage 420. The VVM 411 may facilitate control over and observability into the replay of the test implemented using the display and edit tools and procedures described herein. The user may interact with the VVM 411 through a number of input devices, such as by inputting a selection as with a mouse or inputting a request as with a keyboard. The user may observe the test results on an output device or display. The VVM 411 may run in an application window controlled by the user.

As shown in FIG. 4, a client 410 may be a stand-alone system, as may be of particular interest where the components being tested are highly confidential. Additionally, according to an aspect of an embodiment as shown in FIG. 4, a client 410 may be part of a networked environment.

Figure 5:
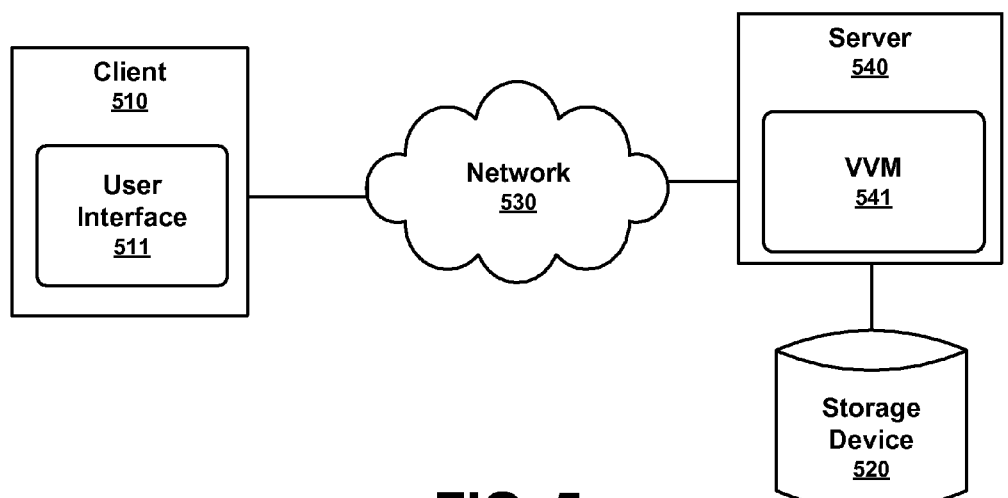
FIG. 5 is a simple block diagram illustrating components of an exemplary system according to an embodiment.

FIG. 5 is a simple block diagram illustrating components of an exemplary system 500 according to an embodiment. As shown in FIG. 5, system 500 may include a client 510 having a user interface 511. The client 510 may be connected to a server 540 via a network 530. The VVM 541, which in this embodiment is located at server 540, may have access to storage device 520 storing hardware models, instruction sets, software packages, instances of the modeled components, state information for the modeled components, captured test data, and other objects utilized by the VVM 541. The server 540 may include a processor that performs a method in accordance with the disclosed embodiments. Such a server then would be part of an overall test system in accordance with the disclosed embodiments.

A user may access a VVM 541 at the server 540 via the client 510 having a user interface 511 capable of accessing and displaying the results of the test. The client 510 may be any computing system that facilitates the user accessing storage device 520, for example a personal computer. The network 530 may be a wired or wireless network that may include a local area network (LAN), a wireless area network, the Internet, or any other network available for accessing storage device 520 from the client 510.

The server 540 may be a network server accessible to the client 510 via the network 530 that may manage access to storage device 520. The user interface 511 may receive instructions regarding a test from the user and utilizing the objects stored in memory storage 520, facilitate a display of the test replay or the information gathered during the test. Multiple different clients (not shown) may access storage device 520 via the server 540 and request access to the objects stored therein.

In another networked environment, the VVM may be executed on a network capable client and access the models, packages and other objects stored in one or more storage devices via a network and communications server.

Figure 6:
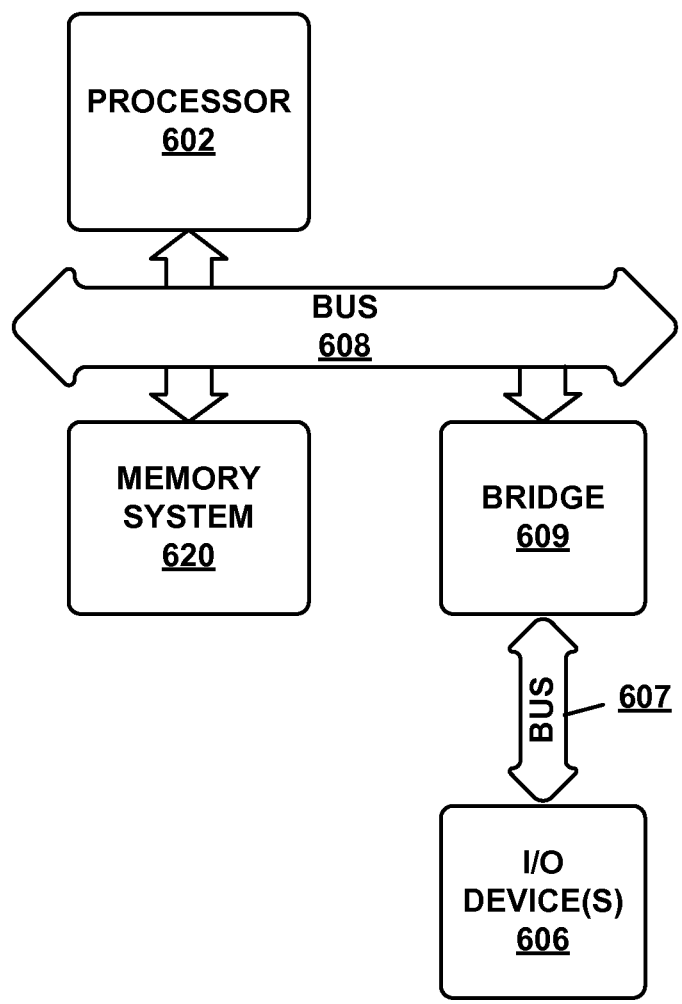
FIG. 6 is a simple block diagram illustrating components of an exemplary client according to an embodiment.

FIG. 6 is a simple block diagram illustrating components of an exemplary client 610 according to an embodiment of the present invention. As shown in FIG. 6, the client 610 configured to execute the VVM as described herein may include a processor 602, a memory system 620 and one or more input/output (I/O) devices 606 in communication. The communication can be implemented in a variety of ways and may include one or more computer buses 607, 608 and/or bridge devices 609 as shown in FIG. 6. The I/O devices 606 can include network adapters and/or mass storage devices from which the client 610 can receive commands for executing the testing and debugging.

In some applications, the modules described hereinabove may be provided as elements of an integrated software system, in which the blocks may be provided as separate elements of a computer program. Some embodiments may be implemented, for example, using a non-transitory computer-readable storage medium or article which may store an instruction or a set of instructions that, if executed by a processor, may cause the processor to perform a method in accordance with the described embodiments. Other applications of the present invention may be embodied as a hybrid system of dedicated hardware and software components. Moreover, not all of the modules described herein need be provided or need be provided as separate units. Additionally, the arrangement of the blocks in FIG. 3 do not necessarily imply a particular order or sequence of events, nor are they intended to exclude other possibilities. For example, the operations depicted at blocks 320, 325, 330, and 335 may occur in any order or substantially simultaneously with each other. Such implementation details are immaterial to the operation of the present invention unless otherwise noted above.

The exemplary methods and computer program instructions may be embodied on a non-transitory computer readable storage medium that may include any medium that can store information. Examples of a computer readable storage medium include electronic circuits, semiconductor memory devices, ROM, flash memory, erasable ROM (EROM), floppy diskette, CD-ROM, optical disk, hard disk, fiber optic medium, or any electromagnetic or optical storage device. In addition, a server or database server may include computer readable media configured to store executable program instructions. The features of the embodiments of the present invention may be implemented in hardware, software, firmware, or a combination thereof and utilized in systems, subsystems, components or subcomponents thereof.

While the invention has been described in detail above with reference to some embodiments, variations within the scope and spirit of the invention will be apparent to those of ordinary skill in the art. Thus, the invention should be considered as limited only by the scope of the appended claims.

What is claimed is:

1. A method for testing a circuit design, the method comprising:
on a hardware based verification platform:
capturing a snapshot of an initial state for a plurality of elements and memory components,
storing, in a storage device remote and removable from the hardware based verification platform, the captured snapshot,
testing the design for at least the plurality of elements and memory components,
capturing a subset of state changes for the tested plurality of elements and memory components, and
storing, in the storage device, the captured subset of state changes; and
on a virtual machine, remote from the hardware based verification platform, and having access to the storage device:
replaying the test of the design, the replaying including reconstructing a waveform for one or more of the plurality of elements and memory components,
wherein:
at least a portion of the reconstructed waveform is based on design data stored in a design database that is separate from the storage device, and the design database is selectively connected to: (i) the hardware based verification platform during the capturing of the snapshot and the subset of state changes and (ii) the virtual machine during the replaying of the test of the design.

2. The method of claim 1, wherein said subset of state changes includes essential run control signals.

3. The method of claim 1, wherein said subset of state changes includes essential state signals.

4. The method of claim 1, wherein said subset of state changes includes a signal identified as significant.

5. The method of claim 1, wherein the waveform for one of the memory components is reconstructed using captured state changes for a write port for that memory component.

6. The method of claim 5, further comprising storing the reconstructed memory component waveform on the storage device for later use when the storage device is connected to the virtual machine.

7. A method for debugging a circuit design, the method comprising:
on a virtual machine having access to stored state changes for a plurality of elements and memory components of the design and having access to a design database, the virtual machine:
replaying a test of the design, the replaying including reconstructing a waveform for one or more of the plurality of elements and memory components,
wherein:
the stored state changes are captured on a storage device during the test of the design on a hardware based verification platform,
the storage device is remote to the hardware based verification platform,
at least a portion of the reconstructed waveform is based on design data stored in the design database that is separate from the storage device, and
the design database is selectively connected to: (i) the hardware based verification platform during the test of the design and (ii) the virtual machine during the replaying of the test of the design.

8. The method of claim 7, further comprising: during the replaying of the test, identifying a predefined condition.

9. The method of claim 8, further comprising stopping the replaying of the test in response to identifying the predefined condition.

10. The method of claim 8, further comprising printing a message to a log in response to identifying the predefined condition.

11. The method of claim 8, further comprising displaying an alert message in response to identifying the predetermined condition.

12. The method of claim 7, wherein multiple users have access to the stored state changes for the plurality of elements and memory components of the design.

13. The method of claim 7, wherein said stored state changes include essential run control signals.

14. The method of claim 7, wherein said stored state changes include essential state signals.

15. The method of claim 7, wherein said stored state changes include a signal identified as significant.

16. The method of claim 7, further comprising reconstructing a waveform for one of the memory components using stored state changes for a write port for that memory component.

17. The method of claim 16, wherein the reconstructed memory component waveform is stored on the storage device for later use when the storage device is connected to the virtual machine.

18. A system comprising:
a memory to store state changes for a plurality of elements and memory components of a circuit design during a test of the design; and
a processor configured to replay the test of the design, the replay including reconstructing a waveform for one or more of the plurality of elements and memory components,
wherein:
at least a portion of the reconstructed waveform is based on design data stored in a design database that is separate from the memory, and
the design database is selectively connected to each of: (i) a hardware based verification platform during the test of the design and (ii) the processor after the test of the design during the replay of the test of the design.

19. The system of claim 18, wherein the processor is further configured to identify a predefined condition during replay of the test.

20. The system of claim 18, wherein a waveform for one of the memory components is reconstructed using stored state changes for a write port for that memory component.

21. The system of claim 20, wherein the memory is configured to store the reconstructed memory component waveform for later use when the memory is connected to the processor configured to replay the test of the design.

* * * * *